Oct. 8, 1968 E. A. KARCHER 3,404,450

METHOD OF FABRICATING AN INTEGRATED CIRCUIT STRUCTURE INCLUDING UNIPOLAR TRANSISTOR AND BIPOLAR TRANSISTOR PORTIONS

Filed Jan. 26, 1966

3,404,450

METHOD OF FABRICATING AN INTEGRATED CIRCUIT STRUCTURE INCLUDING UNIPOLAR TRANSISTOR AND BIPOLAR TRANSISTOR PORTIONS

Edmund A. Karcher, Severna Park, Md., assignor to Westinghouse Electric Corporation, Pittsburgh, Pa., a corporation of Pennsylvania Filed Jan. 26, 1966, Ser. No. 523,099
5 Claims. (Cl. 29—577)

ABSTRACT OF THE DISCLOSURE

Independent operations are employed to determine the characteristics of a bipolar transistor base region and a unipolar transistor channel region in an integrated structure. The base region is formed by impurity diffusion and the channel by epitaxial growth in a particular sequence of operations. Improved unipolar characteristics are provided without degrading bipolar characteristics.

Figure 1:
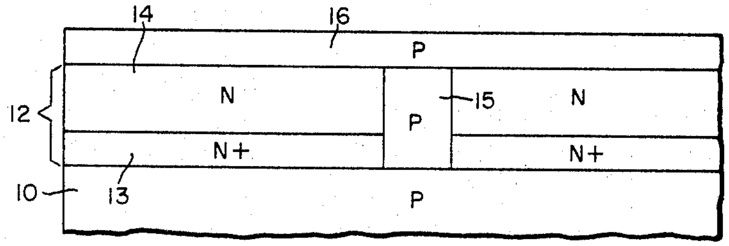

This invention relates to methods of fabricating semiconductor integrated circuits and particularly to those including unipolar transistor and bipolar transistor portions such as are useful in unipolar-bipolar transistor amplifiers.

Integrated circuits including both unipolar and bipolar transistors are desirable particularly for amplifiers at audio frequencies. The high input impedance of the unipolar transistor permits capacitance coupling at low frequencies with small values of capacitance. Lin et al. Patent 3,210,677, Oct. 5, 1965, should be referred to for further information regarding an example of a unipolar-bipolar amplifier that may be made in integrated circuit form in accordance with the present invention. However, it is to be understood that the unipolar-bipolar structure made in accordance with the present invention may be utilized in other types of electrical circuits.

Previously, the most practiced process for the simultaneous fabrication of unipolar and bipolar transistors in an integrated circuit used diffusion techniques to form the necessary regions. The above-mentioned Lin et al. patent typifies such prior technology wherein the unipolar channel region and the bipolar base region are formed of regions diffused in a single diffusion operation. However, this technique does not permit independent control of the parameters of the unipolar and bipolar transistors. Unfortunately, the requirements for good bipolar transistors conflict with those for good unipolar transistors. In particular, it is generally desirable that the channel region of the unipolar transistor be less highly doped than the base region of a bipolar transistor. The characteristics of the unipolar transistor are also more sensitive to any variation in the diffusion process so that even willingness to tolerate relatively low unipolar performance characteristics does not surmount the problem of achieving reproducible structures.

It is therefore an object of the present invention to provide an improved method of fabricating an integrated circuit structure including unipolar transistor and bipolar transistor portions.

Another object is to provide an improved method of fabricating an integrated circuit structure including unipolar transistor and bipolar transistor portions that are compatible with previous integrated circuit technology, but which permits independent control of the parameters of both types of transistors.

The present invention, briefly, achieves the abovementioned and additional objects and advantages in a method that includes, subsequent to the formation of a basic integrated circuit structure including an epitaxial layer with isolation walls therethrough, epitaxially providing a second layer of semiconductive material of the type desired for unipolar channels and bipolar bases; diffusing dopant material of the same type selectively through the second epitaxial layer to form more highly doped regions serving as unipolar transistor source and drain contact regions, bipolar transistor base regions and a continuation of the isolation wall through the second epitaxial layer; diffusing the opposite type of dopant material to form secondary isolation walls surrounding portions of the second epitial layer including a first portion having the unipolar transistor source and drain contacts therein and a second portion having the bipolar transistor base region therein and, in the same diffusion operation, forming a transistor emitter region in the bipolar transistor base region, diffusing additional dopant material of said opposite type to form a gate region in the portion of the second layer between the unipolar transistor source and drain contact regions and making electrical contact to each of the source, drain and gate regions of the unipolar transistor and the base, emitter and collector regions of the bipolar transistor.

It has been found significant in the practice of this invention that following the formation of the conventional epitaxial structure with diffused isolation a portion of the surface be removed so as to lower the surface concentration of the isolation wall and permit the formation of the second layer with a higher resistivity than would otherwise be possible.

Figure 3:
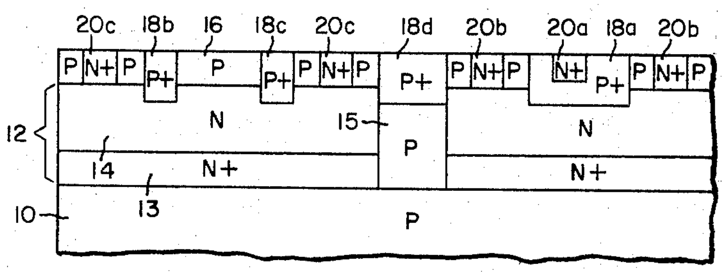
Figure 4:
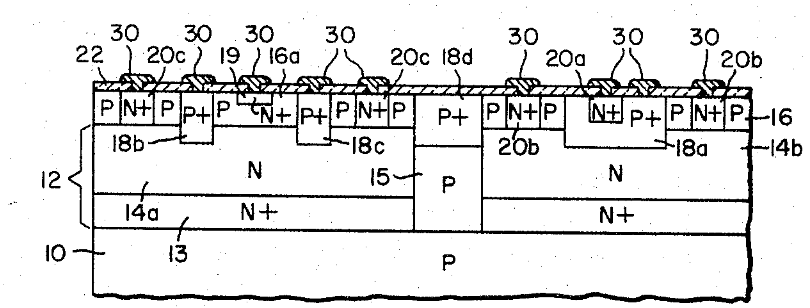
Figure 5:
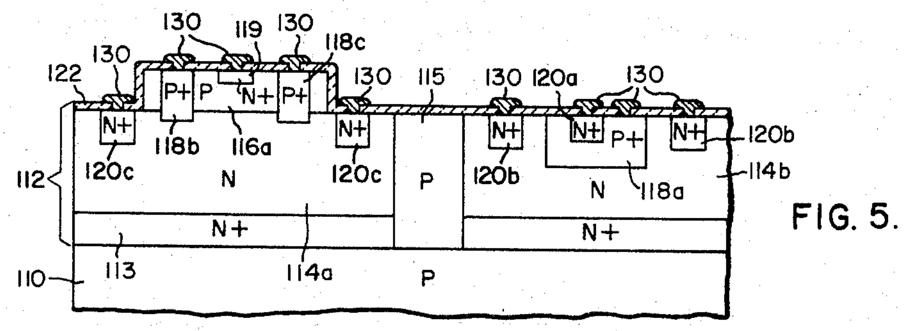

The invention, together with the above-mentioned and additional objects and advantages thereof, will be better understood by referring to the following description taken with the accompanying drawing, wherein:

FIGURES 1 through 4 are partial sectional views of a semiconductor integrated circuit fabricated in accordance with the present invention; and FIG. 5 is a sectional view of an alternative embodiment of the invention.

In the description that follows the various regions of the semiconductor structure are specified as being of a particular type of semiconductivity, being that which is usually preferred in accordance with present technology. However, it is to be understood that the semiconductivity type of the various regions may be reversed from that shown.

The description of the invention also pertains particularly to the use of silicon as the semiconductive material as techniques of epitaxial growth and selective diffusion are fairly highly developed with respect thereto and it is employed in commercial integrated circuit production. It is to be understood that the practice of the invention may be extended to other semiconductor materials.

The individual epitaxial growth and selective diffusion operations employed in the practice of the present invention may be conventional and will not be extensively described herein. Briefly, for providing any of the epitaxially grown layers, the reaction at elevated temperature of a compound of the semiconductor material, such as silicon tetrachloride, with hydrogen in the presence of a gas containing a doping impurity such as phosphine or borane, may be employed. For any of the various selective diffusion operations, conventional oxide masking techniques may be employed using silicon dioxide, for example, as the masking material. Conventional techniques of impurity deposition and redistribution may be employed.

Referring to FIG. 1, the structure is shown after there has been formed by epitaxial growth a first layer 12 of semiconductor material of N type semiconductivity on a P type substrate 10. An acceptor dopant material is diffused selectively through the N type layer 12 to form an isolation wall 15 of P type material separating horizontally disposed portions of the N type layer. There is then formed by epitaxial growth a second layer 16 of P type material over the surface of the N type layer 12 and the isolation wall 15.

The P type substrate 10 is selected in accordance with known criteria primarily to provide mechanical support for the integrated circuit and to permit additional material to be epitaxially grown thereon. The epitaxial first layer 12 is in this example comprised of two vertically disposed portions 13 and 14. A first portion 13 is adjacent the substrate 10 and a second portion 14 is remote from the substrate that has a resistivity appreciably greater than that of the first portion. Consequently, the first portion 13 is designated as being N+. Such a structure is in accordance with prior practice for achieving low saturation resistance in transistor structures as taught in copending patent application Ser. No. 193,452, filed May 9, 1962 by H. C. Lin and assigned to the assignee of the present invention, now Patent 3,236,701, Feb. 22, 1966, which should be referred to for further details.

Where saturation resistance is not important the N type layer 12 may be of uniform composition with its resistivity chosen to provide the desired breakdown voltage of the base-collector junction to be formed therein. Additionally, as an alternative to the illustrated structure, N+ regions may be selectively diffused in the surface of the substrate 10 in the position where bipolar transistors are to be formed with subsequent epitaxial growth of a layer corresponding to layer 14 over that surface in accordance with the teachings of copending patent application Ser. No. 146,624, filed Oct. 20, 1961 by B. T. Murphy and assigned to the assignee of the present invention, now Patent 3,237,062, Feb. 22, 1966, which should be referred to for further details.

Diffusion of the isolation wall 15 may be as previously practiced and is for the purpose of separating the N type layer 12 into laterally isolated portions.

The P type epitaxial layer 16 is of a thickness and resistivity chosen for the desired unipolar channel regions. For this purpose, it is particularly desirable that the layer 16 be thin, preferably less than about 5 microns, and of relatively high resistivity, preferably at least about 3 ohm centimeters. In choosing the resistivity and thickness of the P type epitaxial layer 16, the desired bipolar transistor characteristics are not an important factor.

As mentioned, it is desirable that the P type epitaxial layer 16 be of relatively high resistivity. Since the isolation wall 15 is formed by diffusion and has a final surface concentration of about $10^{19}$ atoms per cubic centimeter, out diffusion from the isolation wall during the P type epitaxial growth may dope it to an undesirably low resistivity. To avoid that, it is preferred that a portion of the N type epitaxial layer 12 and the isolation wall 15, extending a few microns within the surface, be removed prior to the P type epitaxial growth so that a less highly doped portion of the isolation wall is exposed during the epitaxial growth operation. Alternatively, it is suitable to form an additional thin layer of N type epitaxial material on the surface of layer 12 and isolation wall 15 prior to the P type epitaxial growth. The N type additional epitaxial layer can be thin enough so that the portion over the isolation wall is converted by P type by out diffusion during the epitaxial growth process. As an additional alternative, a deposition of acceptor impurities for wall 15 may be made before growing layer 12 so that the doping impurity concentration in the isolation wall is minimal at the surface following the epitaxial growth.

Figure 2:
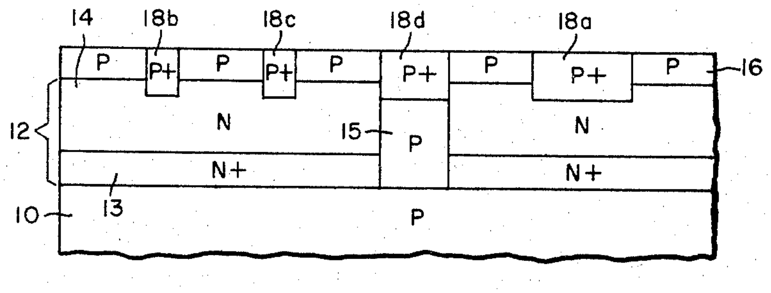

FIG. 2 illustrates the structure after a selective diffusion has been performed with acceptor impurities principally for the purpose of providing a bipolar transistor base region **18*a* of desired characteristics on one side of the isolation wall 15. This diffused region extends through the P type layer 16 into the underlying N type material. The bipolar transistor base region 18*a* thus forms a junction with the N type material of layer 14 that may have a fairly high breakover voltage but does not adversely affect the unipolar transistor channel region. In the unipolar portion of the structure, to the left of the isolation wall 15, two regions 18*b* and 18*c* are formed in the same diffusion operation as that in which base region 18*a* is formed to serve as unipolar transistor source and drain contact regions to facilitate making good ohmic contacts. Additionally, in the same diffusion operation a continuation 18*d* of the isolation wall 15 is made. The region 18*d* may appear unnecessary for isolation purposes; however, it reduces the chances of undesirable channeling or the creation of an N type inversion layer across the structure. The regions 18*a*, 18*b*, 18*c* and 18*d* are designated P+ because of their higher doping than layer 16**.

FIG. 3 illustrates the structure following a diffusion with donor impurities to form regions **20*a*, 20*b* and 20*c* designated N+ as they are of lower resistivity than the N type layer portion 14. The diffused N+ regions serve to form a bipolar transistor emitter region 20*a* as well as contact regions 20*b* and 20*c* to the N type layer 14 in each of the unipolar and bipolar structures. Additionally, regions 20*b* and 20*c* are each formed in a closed pattern to provide secondary isolation walls for electrical isolation within the P type epitaxial layer 16**.

Because of the difference in doping concentration in the diffused bipolar transistor base region **18*a* and the P type epitaxial layer 16, the penetration of the N+ regions 20*b* and 20*c* is considerably deeper in the epitaxial layer 16 than region 20*a* is in the base region, thus accounting for the shallower extent of the emitter region 20*a***.

FIG. 4 shows the structure after completion by performing an additional diffusion with donor impurities within the portion **16*a* of the P type epitaxial layer 16 between the source and drain contact regions 18*b* and 18*c* to provide a unipolar transistor gate region 19. The structure of FIG. 4 also shows the final oxide passivation layer 22 and ohmic contacts 30** to the various regions of the structure. Conductive interconnections between elements may be made as desired by conventional techniques.

In the left-hand portion of the structure a unipolar transistor is provided that includes a channel region **16*a* and source and drain contact regions 18*b* and 18*c* at the extremities thereof. Upper and lower gate regions 19 and 14*a* (of which region 20*c* is effectively a part) are provided in PN junction forming relationship with the channel region so that by the application of suitable signals thereto, modulation of current between the source and drain contacts is achieved. The contacts to the upper and lower gate regions 19 and 14*a*** may, of course, be joined.

In the right-hand portion of the structure, a bipolar transistor is provided that may be formed with desirable characteristics without restricting the performance of the unipolar transistor. Emitter region **20*a*, base region 20*b* and collector region 14*b* (of which region 20*b*** is effectively a part) cooperate to form the transistor structure.

It will be understood that the practice of the present invention is thoroughly compatible with previous techniques. The P+ diffusion for the transistor base may, as previously, also be used for the formation of diffused resistance regions. In that case, an N+ secondary isolation wall should surround the P+ diffused resistor of the nature of walls **20*b* and 20*c***.

A further alternative to the practice of the present invention is to form a P type epitaxial layer only in those areas of the surface of layer 14 desired for unipolar transistor formation. An advantage gained would be to reduce the area required for resistor regions by avoiding the necessity of having the N+ secondary isolation wall around each diffused resistor. Also, problems of out diffusion are avoided because the mask for the selective epitaxial growth (say of silicon dioxide) acts as a stop to the impurities in the unexposed region.

It will be suitable for the selective epitaxially grown channel region to be formed on the surface of the N layer or a suitably etched out region may be formed first and the epitaxial grown region deposited therein. FIG. 5 illustrates a structure using a selective epitaxial layer 116a for the unipolar channel region. The bipolar transistor structure may be conventionally formed. In FIG. 5 reference numerals for the various elements have the same last two digits as for the corresponding elements of FIG. 4. As an alternative to the indicated location of bottom gate contact 120c, it may be formed by diffusion through the selectively grown epitaxial layer into layer 114a.

Referring again to the illustrated structure in FIGS. 1 to 4, following are more detailed examples of suitable parameter values. All values are approximate and are subject to variation in accordance with known technology.

| | |
|---|---|
| Substrate **10** | 10 to 30 ohm-centimeters; 8 mils thickness. |
| Layer **13** | 0.1 ohm-centimeter; 3 to 4 microns thickness. |
| Layer **14** | 1 to 2 ohm-centimeters; 10 to 12 microns thickness. |
| Isolation Wall **15** | Original surface concentration of $10^{19}$ atoms per cc. after which surface oxide is removed by HF etchant and 3 microns of surface is removed by HCl etchant to reduce isolation wall concentration to less than $10^{18}$ atoms per cc. |
| Layer **16** | 3 to 6 ohm-centimeters; 3 to 4 microns thickness. |
| Regions **18a**, **18b**, **18c** and **18d** | Surface concentration of $10^{18}$ atoms per cc. |
| Regions **20a**, **20b** and **20c** | Surface concentration of $10^{21}$ atoms per cc. |
| Region **19** | Surface concentration of $10^{21}$ atoms per cc. |

Unipolar-bipolar structures have been successfully made as shown in FIGS. 1 to 4. The unipolar transistor devices had a pinch-off voltage in the range of from 2 to 6 volts, a pinch-off current in the range from 75 to 170 microamperes and a transconductance of 30 to 80 micromhos. Improving the pinch-off current and transconductance merely requires adjusting the dimensions of the device utilizing known principles. The breakover voltage of the unipolar transistor averaged greater than 100 volts with maximum values of 150 volts.

The bipolar portion showed current gain of greater than 25 and breakover voltage of 50 volts. Isolation voltage between the two elements ranged from 100 to 200 volts. Success in obtaining good reproducibility between runs was achieved.

While the invention has been shown and described in a few forms only, it will be understood that various modifications may be made without departing from the spirit and scope thereof.

What is claimed is:

1. A method of fabricating an integrated circuit structure including unipolar transistor and bipolar transistor portions comprising: (1) forming by epitaxial growth a first layer of semiconductive material of a first type of semiconductivity on a substrate of a second type of semiconductivity; (2) diffusing dopant material capable of imparting semiconductivity of said second type selectively through said first layer to form an isolation wall of said second type separating portions of said first layer; (3) forming by epitaxial growth a second layer of semiconductive material of said second type over said portions of said first layer and said isolation wall; (4) diffusing dopant material capable of imparting semiconductivity of said second type selectively through said second layer to form simultaneously (a) unipolar transistor source and drain contact regions over a first of said portions of said first layer, (b) a bipolar transistor base region over a second of said portions of said first layer, and (c) a continuation of said isolation wall; (5) diffusing dopant material capable of imparting semiconductivity of said first type selectively through said second layer to form simultaneously (a) secondary isolation walls of said first type surrounding portions of said second layer including a first portion having said unipolar transistor source and drain contact regions therein and a second portion having said bipolar transistor base region therein and (b) a bipolar transistor emitter region in said bipolar transistor base region; (6) diffusing dopant material capable of imparting semiconductivity of said first type selectively into a portion of said second layer between said unipolar transistor source and drain regions to form a unipolar transistor gate region; and (7) making electrical contact to each of said unipolar transistor source, drain and gate regions and the one of said secondary isolation walls surrounding them and to each of said bipolar transistor base and emitter regions and the one of said secondary isolation walls surrounding them.

2. A method in accordance with claim 1 wherein: said first layer comprises a first portion of a first resistivity adjacent said substrate and a second portion of a second resistivity substantially greater than said first resistivity remote from said substrate.

3. A method in accordance with claim 1 wherein: said substrate has selectively diffused therein regions of said first type of semiconductivity in portions desired for formation of bipolar transistor elements.

4. A method in accordance with claim 1 wherein: between steps (2) and (3), a portion of the surface of said first layer and said isolation wall is removed to reduce the the surface concentration of the isolation wall and facilitate growth of a high resistivity second layer.

5. In a method of fabricating an integrated circuit structure including unipolar transistor and bipolar transistor portions, the steps comprising: (1) forming by epitaxial growth a first layer of semiconductive material of a first type of semiconductivity on a substrate of a second type of semiconductivity; (2) diffusing dopant material capable of imparting semiconductivity of said second type selectively through said first layer to form an isolation wall of said second type separating portions of said first layer; (3) forming by selective epitaxial growth a second layer of semiconductive material of said second type over a first of said portions of said first layer to form a unipolar transistor channel region; (4) diffusing dopant material capable of imparting semiconductivity of said second type selectively into (a) a second of said portions of said first layer to form a bipolar transistor base region and, simultaneously, into (b) said second layer to form unipolar transistor source and drain contact regions; (5) diffusing dopant material capable of imparting semiconductivity of said first type selectively into (a) said base region to form an emitter region, into (b) said second of said portions of first layer, spaced from said base region to form a collector contact region, and into (c) said second layer, between said source and drain contact regions, to form a gate region.

References Cited

UNITED STATES PATENTS

| | | | |
|---|---|---|---|
| 3,246,214 | 4/1966 | Hugle | 29—576 |
| 3,260,902 | 7/1966 | Porter | 29—576 |
| 3,265,542 | 8/1966 | Hirshon | 29—578 |
| 3,290,753 | 12/1966 | Chang | 29—577 |
| 3,296,040 | 1/1967 | Wigton | 148—175 |

WILLIAM I. BROOKS, *Primary Examiner.*